United States Patent
Kim et al.

(10) Patent No.: US 7,645,668 B2
(45) Date of Patent: Jan. 12, 2010

(54) CHARGE TRAPPING TYPE SEMICONDUCTOR MEMORY DEVICE AND METHOD OF MANUFACTURING THE SAME

(75) Inventors: Chang-Seob Kim, Gwangju-si (KR); Jeong-Lim Nam, Yongin-si (KR); Won-Jin Kim, Suwon-si (KR); Guk-Hyon Yon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 141 days.

(21) Appl. No.: 11/594,912

(22) Filed: Nov. 9, 2006

(65) Prior Publication Data

US 2008/0067571 A1    Mar. 20, 2008

(30) Foreign Application Priority Data

Sep. 18, 2006    (KR) .................... 10-2006-0090282

(51) Int. Cl.
*H01L 21/336*    (2006.01)

(52) U.S. Cl. .................. 438/257; 438/287; 438/288; 438/296; 438/297; 257/324; 257/E21.002

(58) Field of Classification Search ............... 257/324, 257/E21.002; 438/257, 287, 288, 296, 297
See application file for complete search history.

(56) References Cited

U.S. PATENT DOCUMENTS

| | | | |
|---|---|---|---|
| 5,599,727 A | 2/1997 | Hakozaki et al. | |
| 6,300,203 B1 * | 10/2001 | Buynoski et al. | 438/287 |
| 6,849,514 B2 | 2/2005 | Han | |
| 2001/0002714 A1 * | 6/2001 | Doan | 257/316 |
| 2003/0122204 A1 * | 7/2003 | Nomoto et al. | 257/406 |
| 2003/0155605 A1 * | 8/2003 | Jong et al. | 257/314 |
| 2005/0214996 A1 * | 9/2005 | Yoshino | 438/197 |

FOREIGN PATENT DOCUMENTS

| | | |
|---|---|---|
| JP | 08-222647 | 8/1996 |
| KR | 10-0241512 | 11/1999 |
| KR | 10-2004-0060492 | 7/2004 |

* cited by examiner

*Primary Examiner*—Lex Malsawma
*Assistant Examiner*—Robert Huber
(74) *Attorney, Agent, or Firm*—Lee & Morse, P.C.

(57) ABSTRACT

A memory device includes a charge trapping layer on a substrate, an insulating layer on the substrate adjacent to the charge trapping layer and exposing an upper surface of the charge trapping layer, a dielectric layer on the exposed charge trapping layer and on the insulating layer, and an electrode on the dielectric layer, the electrode corresponding to the charge trapping layer.

12 Claims, 6 Drawing Sheets

CHARGE TRAPPING TYPE SEMICONDUCTOR MEMORY DEVICE AND METHOD OF MANUFACTURING THE SAME

BACKGROUND OF THE INVENTION

1. Field of the Invention

Embodiments of the present invention relate to a memory device such as a charge trapping type non-volatile memory device and a method of manufacturing the same. More particularly, embodiments of the present invention relate to a memory device such as a charge trapping type non-volatile memory device including a cell transistor having a desired sidewall profile and configured to reduce charge spreading, and a method of manufacturing the same.

2. Description of the Related Art

Generally, non-volatile semiconductor memory devices include floating gate type non-volatile memory devices and charge trapping type non-volatile memory devices, the types corresponding to the structures of the respective unit memory cells. In the floating gate type memory device, a unit memory cell typically includes a tunnel oxide layer formed on a semiconductor substrate, as well as a floating gate, a dielectric layer and a control gate. Data may be stored in the floating gate as free charges that are injected into the floating gate.

Charges injected into the floating gate may dissipate if defects occur in the tunnel oxide layer, which is disposed between the substrate and the floating gate. In order to reduce or prevent such dissipation, the thickness of the tunnel oxide layer of the floating gate type memory device may be increased. However, a high driving voltage may be required when the floating gate type memory device has a thick tunnel oxide layer. Accordingly, a structure of a peripheral circuit for the floating gate type memory device may become more complicated. As a result, it may be difficult to achieve high levels of integration for the floating gate type memory device.

The charge trapping type memory device may have a silicon-oxide-nitride-oxide-semiconductor (SONOS) structure, which may be referred to as a SONOS type non-volatile memory device. In the SONOS type non-volatile memory device, the unit memory cell may include a tunnel oxide layer on the semiconductor substrate, a charge trapping layer, a dielectric layer, and an electrode. Data may be stored into the SONOS type non-volatile memory device corresponding to charges injected into charge trapping sites of the charge trapping layer. For example, charges may be trapped in deep-level trapping sites of a silicon nitride layer, while the tunnel oxide layer may be relatively thin.

In the conventional SONOS type non-volatile memory device, charges may be considered to be fixed in the charge trapping sites. Accordingly, memory cells of the conventional SONOS type non-volatile memory device may have charge trapping layer patterns, e.g., the silicon nitride layer patterns, connected to one another. For example, adjacent silicon nitride layer patterns may be connected to one another, rather than being discrete patterns such as island-shaped silicon nitride layer patterns.

However, in such a configuration, charges stored in the charge trapping layer patterns may move, e.g., in a horizontal direction along a plane of the charge trapping layer patterns, after the charges are stored therein. If the stored charges migrate horizontally, a cell transistor may partially lose the stored charges, so that a threshold voltage of the cell transistor may not reach a desired level. Thus, data stored in the memory cell of the conventional SONOS type non-volatile memory device may be deteriorated or undesirably changed.

In order to reduce or eliminate charge migration, the charge trapping type memory device may have a discrete charge trapping layer pattern, e.g., an island shape that is not connected to an adjacent memory device. For example, a silicon nitride layer may be patterned in two directions, e.g., along an X-axis direction and a Y-axis direction, in order to isolate the silicon nitride layer of one memory cell from an adjacent memory cell.

To form a charge trapping type memory device having a discrete charge trapping layer pattern, the tunnel oxide layer, the charge trapping layer and a dielectric layer may be formed on a substrate, and these layers may be etched to form a tunnel oxide layer pattern, a charge trapping layer pattern and a dielectric layer pattern. Thus, each of the tunnel oxide layer pattern, the charge trapping layer pattern and the dielectric layer pattern may have a same discrete shape on the substrate, i.e., they may be stacked on the substrate.

However, it may be difficult to implement such an approach for some high dielectric constant materials, e.g., if the dielectric layer is formed of a metal oxide. In particular, it may be difficult to pattern the dielectric layer using a plasma-based dry etching process. For example, the dielectric layer may be thin and the etching process for forming the dielectric layer pattern may be somewhat excessively carried out.

When performing etching processes for patterning a silicon nitride layer and a tunnel oxide layer after etching the dielectric layer, a sidewall of an electrode formed on the dielectric layer pattern may be seriously damaged, and a cell transistor of the charge trapping type non-volatile memory device may have a poor sidewall profile. As a result, the resistance of the electrode may increase, electrical characteristics of the charge trapping type non-volatile memory device may deteriorate due to a reduced width of the electrode, etc.

SUMMARY OF THE INVENTION

Example embodiments of the present invention are therefore directed to a semiconductor memory device such as a charge trapping type non-volatile memory device and a method of manufacturing the same, which substantially overcome one or more of the problems due to the limitations and disadvantages of the related art.

It is therefore a feature of an embodiment of the present invention to provide a charge trapping type non-volatile memory device that includes a discrete charge trapping element and a dielectric layer that is continuous with respect to multiple memory devices.

It is therefore another feature of an embodiment of the present invention to provide a method of manufacturing a charge trapping type non-volatile memory device that includes forming discrete charge trapping elements for adjacent memory devices and a dielectric layer that is continuous with respect to the memory devices.

It is therefore a further feature of an embodiment of the present invention to provide a method of manufacturing a charge trapping type non-volatile memory device that includes patterning an electrode layer without patterning an underlying dielectric layer.

At least one of the above and other features and advantages of the present invention may be realized by providing a memory device including a charge trapping layer on a substrate, an insulating layer on the substrate adjacent to the charge trapping layer and exposing an upper surface of the charge trapping layer, a dielectric layer on the exposed charge trapping layer and on the insulating layer, and an electrode on the dielectric layer, the electrode corresponding to the charge trapping layer.

The memory device may be close by an adjacent memory device, the charge trapping layer may be discrete to the memory device, the adjacent memory device may include an adjacent charge trapping layer discrete to the adjacent memory device, and the dielectric layer may be continuous across the charge trapping layer and the adjacent charge trapping layer.

An active region of the substrate may be defined by an isolation layer, the isolation layer may be disposed in a trench in the substrate and project above the respective charge trapping layers, and the dielectric layer may be on the isolation layer.

The charge trapping layer may include a nitride-based charge trapping material. The nitride-based charge trapping material may include silicon nitride. The dielectric layer may include metal oxide. The electrode may have a width that is substantially greater than a corresponding width of the charge trapping layer. The device may have a SONOS structure defined by the substrate, a tunneling layer on the substrate, the charge trapping layer, the dielectric layer, and the electrode.

At least one of the above and other features and advantages of the present invention may also be realized by providing a memory including a first memory device, the first memory device including a first charge trapping element on a substrate and a first tunneling layer between the first charge trapping element and the substrate, a second memory device, the second memory device including a second charge trapping element on the substrate and a second tunneling layer between the second charge trapping element and the substrate, a dielectric layer extending across the first and the second charge trapping elements, a first electrode structure on the dielectric layer and corresponding to the first charge trapping element, and a second electrode structure on the dielectric layer and corresponding to the second charge trapping element, wherein the substrate, the first tunneling layer, the first charge trapping element, the dielectric layer and the first electrode structure define a first SONOS structure, and the substrate, the second tunneling layer, the second charge trapping element, the dielectric layer and the second electrode structure define a second SONOS structure.

The first charge trapping element may be discrete to the first memory device, the second charge trapping element may be discrete to the second memory device, and the dielectric layer may be shared by the first and the second memory devices. The first and the second memory devices may be in respective active regions that are separated by an isolation layer. The isolation layer may be disposed in a trench in the substrate and extend above the first and the second charge trapping elements, and the dielectric layer may be formed on the isolation layer and on the first and the second charge trapping elements.

At least one of the above and other features and advantages of the present invention may be realized by providing a method of manufacturing a memory device including forming a charge trapping layer on a substrate, forming an insulating layer on the substrate adjacent to the charge trapping layer, wherein an upper surface of the charge trapping layer is exposed by the insulating layer, forming a dielectric layer on the exposed charge trapping layer and on the adjacent insulating layer, and forming an electrode on the dielectric layer, the electrode corresponding to the charge trapping layer.

The charge trapping layer may include a nitride-based charge trapping material. The dielectric layer may include metal oxide. The electrode may have a width that is substantially greater than a corresponding width of the charge trapping layer.

The memory device may be close by an adjacent memory device, the charge trapping layer may be discrete to the memory device, the adjacent memory device may include an adjacent charge trapping layer discrete to the adjacent memory device, and the dielectric layer may be continuous across the charge trapping layer and the adjacent charge trapping layer.

The method may further include forming an isolation layer in a trench in the substrate, wherein the isolation layer may project above the charge trapping layer, and the dielectric layer may be disposed on the isolation layer.

Forming the electrode may include forming an electrode layer on the dielectric layer and patterning the electrode layer without patterning the dielectric layer.

A protection layer and a buffer layer may be formed on the charge trapping layer pattern, and forming the insulating layer may include depositing an insulating material on the substrate to cover the charge trapping layer, the protection layer, and the buffer layer, and polishing the insulating material until it has a thickness in a range of about 50 Å to about 100 Å, wherein the polishing also exposes the protection layer.

The method may further include forming an isolation layer in a trench in the substrate, wherein the isolation layer projects above the protection layer, removing the protection layer so as to expose the buffer layer, the buffer layer having a height lower than that of the insulating layer; and removing the buffer layer and partially removing the insulating layer and the isolation layer while maintaining an upper surface of the insulating layer at a height equal to or above a height of an upper surface of the charge trapping layer.

BRIEF DESCRIPTION OF THE DRAWINGS

The above and other features and advantages of the present invention will become more apparent to those of ordinary skill in the art by describing in detail example embodiments thereof with reference to the attached drawings, in which.

DETAILED DESCRIPTION OF THE INVENTION

Korean Patent Application No. 2006-90282, filed on Sep. 18, 2006, in the Korean Intellectual Property Office, and entitled: "Charge Trapping Type Non-Volatile Memory Device and Method of Manufacturing the Same," is incorporated by reference herein in its entirety.

The present invention will now be described more fully hereinafter with reference to the accompanying drawings, in which example embodiments of the invention are illustrated. The present invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that when an element or layer is referred to as being "connected to" or "coupled to" another element or layer, it can be directly connected or coupled to the other element or layer or intervening elements or layers may be present. In contrast, when an element is referred to as being "directly on," "directly connected to" or "directly coupled to" another element or layer, there are no intervening elements or layers present. To the extent used herein, the term "and/or" includes any and all combinations of one or more of the associated listed items.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result of, e.g., manufacturing techniques and/or tolerances, are to be expected. Thus, example embodiments of the present invention should not be construed as limited to the particular shapes of regions illustrated herein, and may include deviations in shapes that result from, e.g., manufacturing. For example, an implanted region illustrated as a rectangle may have rounded or curved features and/or a gradient of implant concentration at its edges, rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

In the figures, the dimensions of layers and regions may be exaggerated for clarity of illustration. Like reference numerals refer to like elements throughout.

Figure 1:
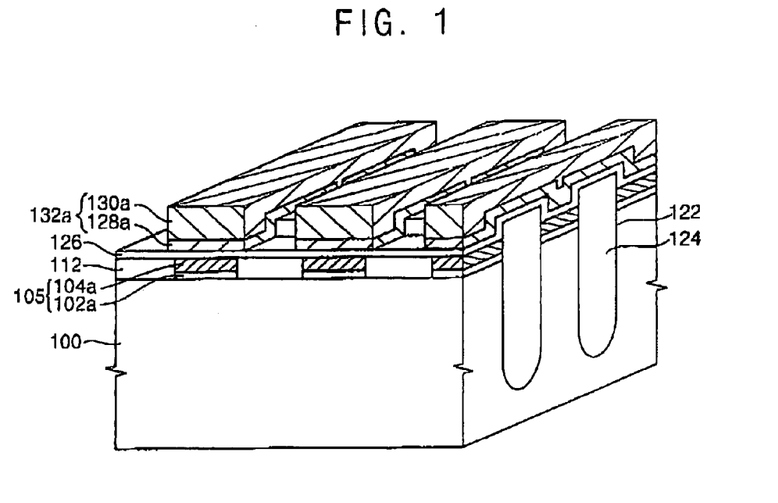
FIG. 1 illustrates a perspective view of a charge trapping type non-volatile memory device in accordance with an example embodiment of the present invention.

FIG. 1 illustrates a perspective view of a charge trapping type non-volatile memory device in accordance with an example embodiment of the present invention. Referring to FIG. 1, the charge trapping type non-volatile memory device may be formed on a substrate 100, which may include a semiconductor material such as silicon. The charge trapping type non-volatile memory device may include discrete charge trapping layer patterns, while adjacent memory devices may have a common dielectric layer.

In detail, one or more trenches 122 may be formed in the substrate 100, e.g., at an upper portion thereof. The trenches 122 may extend in a first direction. Isolation layer patterns 124 may be disposed in the trenches 122, respectively, and may fill the trenches 122. Each of the isolation layer patterns 124 may include, e.g., an oxide. The isolation layer patterns 124 may define active and field regions of the substrate 100, e.g., a first portion of the substrate 100 may correspond to a field region, and a second portion of the substrate 100, adjacent to the isolation layer pattern 124, may correspond to an active region.

A charge trapping structure 105 may be formed in the active region of the substrate 100. The charge trapping structure 105 may include a tunnel oxide layer pattern 102a and a charge trapping layer pattern 104a, which may be a nitride layer pattern. The tunnel oxide layer pattern 102a and the charge trapping layer pattern 104a may be discrete, i.e., not connected to an adjacent memory device. For example, the tunnel oxide layer pattern 102a and the charge trapping layer pattern 104a may have island shapes, respectively. Adjacent tunnel oxide layer patterns 102a and adjacent charge trapping layer patterns 104a may be separated from each other by a predetermined distance. The charge trapping layer pattern 104a may include silicon nitride, which may ensure sufficient charge trapping sites therein.

An insulating interlayer 112 may be formed on the substrate 100 around the charge trapping structure 105, e.g., enclosing the charge trapping structure 105. An upper surface of the charge trapping layer pattern 104a may be exposed, i.e., not covered, by the insulating interlayer 112.

A dielectric layer 126 may be formed on the charge trapping layer pattern 104a, the insulating interlayer 112 and/or the isolation layer pattern 124. The dielectric layer 126 may include, e.g., a metal oxide having a high dielectric constant. The dielectric layer 126 may include, e.g., one or more of aluminum oxide, hafnium oxide, zirconium oxide, titanium oxide, tantalum oxide, etc. In an implementation, the dielectric layer 126 may include aluminum oxide.

The dielectric layer 126 may be continuous across adjacent memory devices. That is, the dielectric layer 126 may cover the charge trapping layer patterns 104a, the insulating interlayers 112 and the isolation layer patterns 124 of adjacent memory devices without being patterned as discrete dielectric layers for each memory device. However, the underlying charge trapping layer patterns 104a may not be continuous, i.e., they may be discrete to each memory device.

As described above, an upper surface of the charge trapping layer pattern 104a may be exposed, i.e., not covered, by the insulating interlayer 112. The upper surface of the insulating interlayer 112 may be higher than that of the charge trapping layer pattern 104a. In another implementation, the upper surface of the charge trapping layer pattern 104a may be at the same height as, i.e., even with, the upper surface of the insulating interlayer 112, so as to prevent a step between the insulating interlayer 112 and the charge trapping layer pattern 104a. That is, the overall thickness of the charge trapping structure 105 may be substantially the same as the thickness of the insulating interlayer 112.

If the upper surface of the insulating interlayer 112 is lower than that of the charge trapping layer pattern 104a, the dielectric layer 126 formed on the charge trapping layer pattern 104a may be too close to the tunnel oxide layer pattern 102a, and charges may be trapped in the charge trapping layer pattern 104a and the dielectric layer 126 during a programming operation of the charge trapping type non-volatile memory device. Such charge trapping may result in a failure during a programming operation.

An electrode structure 132 may be formed on the dielectric layer 126. The electrode structure 132 may be positioned so as to correspond to the charge trapping layer pattern 104a. The electrode structure 132 may include one or more layers, e.g., a lower electrode 128a and an upper electrode 130a. The electrode structure 132 may have a generally linear structure that extends in a second direction substantially perpendicular to the first direction.

As illustrated in FIG. 1, the electrode structure 132 may have a width that is substantially greater than the corresponding width of the charge trapping layer pattern 104a. If the electrode structure 132 has a width that is less than that of the charge trapping layer pattern 104a, lateral portions of the charge trapping layer pattern 104a may not serve as a gate of a cell transistor of the charge trapping type non-volatile memory device. Accordingly, if changes move into the lateral portions of the charge trapping layer pattern 104a, the cell transistor may not have a sufficient threshold voltage, and a failure of an operation of the cell transistor may result.

The electrode structure 132 may have a width of about 105% to about 120% of the width of the charge trapping layer pattern 104a. Setting the width of the electrode structure 132 to be less than about 105% of the width of the charge trapping layer pattern 104a may increase the likelihood of an alignment error, since such a width may reduce a process margin during formation of the electrode structure 132. That is, the electrode structure 132 may not be located at a desired position over the charge trapping layer pattern 104a.

Setting the width of the electrode structure to be greater than about 120% of the width of the charge trapping layer pattern 104a may increase the likelihood of generating parasitic capacitance with an adjacent electrode structure 132, since such a width may reduce the distance between adjacent electrode structures 132. Moreover, undue reductions in the distance between adjacent electrode structures 132 may lead to an electrical short between the adjacent electrode structures 132. Thus, if the electrode structure 132 has a width substantially wider than the width of the charge trapping layer pattern 104a, the alignment error margin of the process for forming the electrode structure 132 may be increased, and a resistance of the electrode structure 132 may be decreased.

In an implementation, the electrode structure 132 may include at least two layers, e.g., a lower electrode 128a and an upper electrode 130a. Each of the lower electrode 128a and the upper electrode 130a may have a width that is greater than the width of the charge trapping layer pattern 104a.

The electrode structure 132 may include at least two conductive layers. The electrode structure 132 may include a metal or a metal nitride. For example, the electrode 132 may include one or more of tungsten, tantalum, aluminum, titanium, tungsten nitride, tantalum nitride, titanium nitride, aluminum nitride, etc. The lower electrode 128a may include a first conductive material having a high work function, e.g., above about 4.5 eV.

In an implementation, the first conductive material may have a work function of about 4.7 eV to about 5.3 eV. If the lower electrode 128a includes such a high work function material, charges may not be inversely tunneled into the charge trapping layer pattern 104a from the electrode structure 132 during an erasing operation of the charge trapping type non-volatile memory device.

The upper electrode 130a may include a second conductive material having a resistance lower than that of the first conductive material. The upper electrode 130a may be easily etched compared to the lower electrode 128a.

A barrier metal layer pattern (not shown) may be disposed between the lower electrode 128a and the upper electrode 130a. The metal barrier layer pattern may include, e.g., a metal nitride. In an implementation, the lower electrode 128a may include tantalum nitride, and the metal barrier layer pattern may include tungsten nitride. Additionally, the upper electrode 130a may include tungsten.

As described above, the charge trapping type non-volatile memory device may include the charge trapping layer pattern 104a having an island shape, so charges stored in the charge trapping layer pattern 104a may not move horizontally. Therefore, a failure of an operation of the charge trapping type non-volatile memory device, which might otherwise be caused by the horizontal migration of charges, may be prevented. Additionally, the dielectric layer 126 may cover the charge trapping layer pattern 104a, the insulating interlayer 112 and the isolation layer pattern 124 without performing any patterning process for the dielectric layer 126. Therefore, the electrode structure 132 positioned on the dielectric layer 126 may have an improved sidewall profile. In particular, the sidewall of the electrode structure 132 may be substantially perpendicular to the dielectric layer 126. Furthermore, an overlapping margin between the charge trapping layer pattern 104a and the electrode structure 132 may be increased by making the width of the electrode structure 132 wider than that of the charge trapping layer pattern 104a. Therefore, a sufficient electric field may be applied to the charge trapping layer pattern 104a through the electrode structure 132, while accommodating process variations between the electrode structure 132 and the charge trapping layer pattern 104a. Also, the electrode structure 132 may have a reduced resistance.

Figure 9:
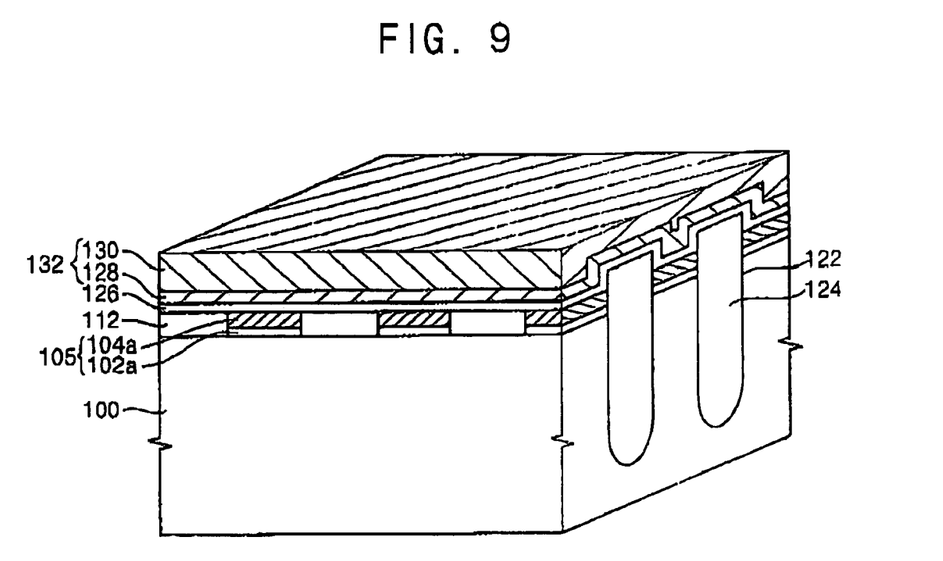
Figure 10:
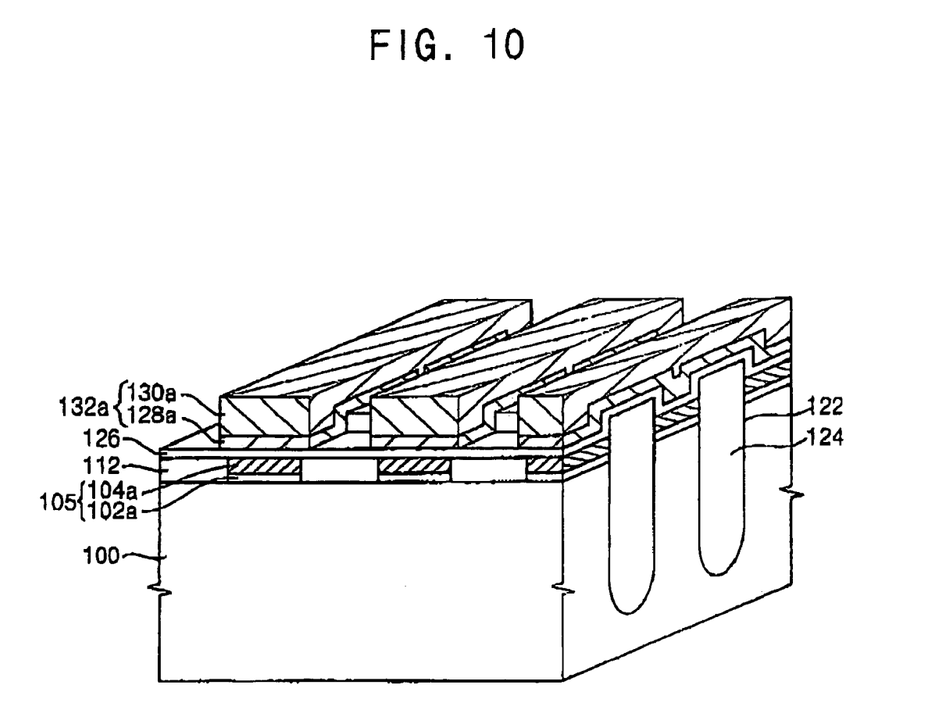
Figure 11:
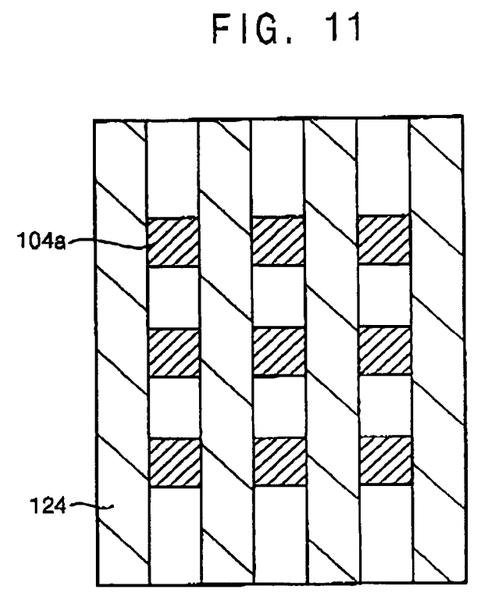
FIGS. 11 and 12 illustrate plan views of stages in the method of FIGS. 2 to 10.
Figure 12:
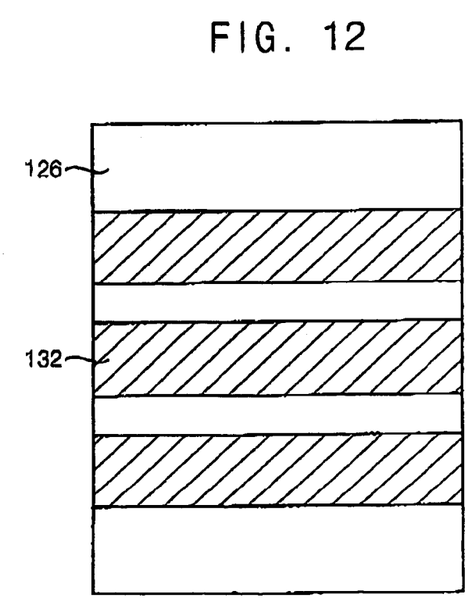

FIGS. 2 to 10 illustrate perspective views of stages in a method of manufacturing a charge trapping type non-volatile memory device in accordance with an example embodiment of the present invention, and FIGS. 11 and 12 illustrate plan views of stages in the method of FIGS. 2 to 10.

Figure 2:
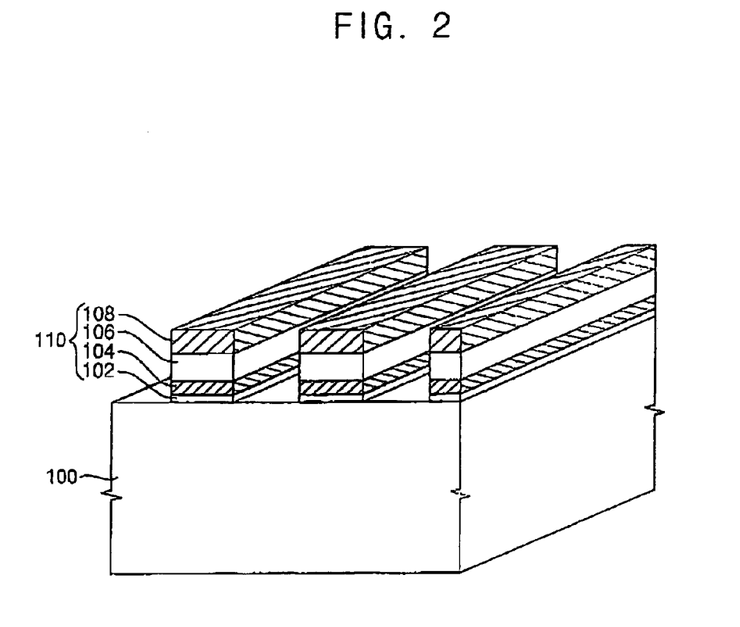
FIGS. 2 to 10 illustrate perspective views of stages in a method of manufacturing a charge trapping type non-volatile memory device in accordance with an example embodiment of the present invention.

Referring to FIG. 2, a substrate 100 may be provided. The substrate 100 may include a semiconductor material, e.g., silicon. A preliminary charge trapping structure 110 may be formed on the substrate 100. The preliminary charge trapping structure 110 may include a preliminary tunnel oxide layer pattern 102, a preliminary charge trapping layer pattern 104, a preliminary buffer layer pattern 106 and a preliminary first protection layer pattern 108, which may be sequentially formed on the substrate 100. The preliminary charge trapping structure 110 may have a generally linear shape and may extend in a first direction on the substrate 100.

In an implementation, a tunnel oxide layer (not shown) may be formed on the substrate 100, e.g., using a thermal oxidation process. A charge trapping layer (not shown), e.g., a nitride layer, may be formed on the tunnel oxide layer. Where a nitride layer is used as the charge trapping layer, it may be formed using, e.g., silicon nitride. The charge trapping layer may be formed by, e.g., a chemical vapor deposition (CVD) process.

A buffer layer (not shown) may be formed on the charge trapping layer. The buffer layer may protect the charge trapping layer in successive etching processes. Since the buffer layer may be completely removed before forming a subsequent dielectric layer, e.g., a subsequent dielectric layer 126 as illustrated in FIG. 9, the buffer layer may be formed using a material that is easily removed without damage to the charge trapping layer. For example, the buffer layer may be formed using a middle temperature oxide (MTO).

Figure 5:
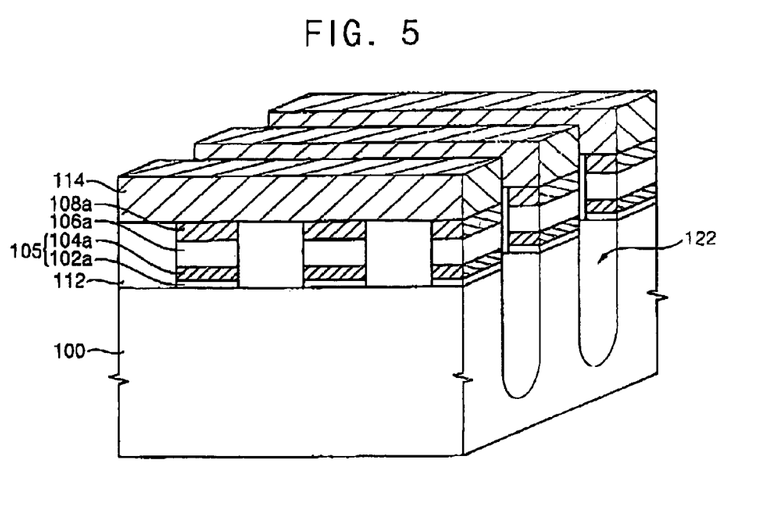

A first protection layer (not shown) may be formed on the buffer layer. The first protection layer may serve as a polishing stop layer in a subsequent polishing process. The first protection layer may be formed using, e.g., a nitride such as silicon nitride. The first protection layer may have a thickness in a range of about 100 Å to about 1,500 Å. If the thickness of the first protection layer is less than about 100 Å, a subsequent polishing process may not stop properly at the first protection layer. If the thickness of the first protection layer is greater than about 1,500 Å, a subsequently formed trench, e.g., a trench 122 as illustrated in FIG. 5, may not be properly formed on the substrate 100 due to a large height difference between the buffer layer and an insulating interlayer, e.g., an insulating interlayer 112 as illustrated in FIG. 3.

A photoresist pattern (not shown) may be formed on the first protection layer, the first protection layer, the buffer layer, the charge trapping layer and the tunnel oxide layer, and these layers may be patterned using the photoresist pattern as an etching mask to yield the preliminary tunnel oxide layer pattern 102, the preliminary charge trapping layer pattern 104, the preliminary buffer layer pattern 106 and the preliminary first protection layer pattern 108, sequentially, formed on the substrate 100. That is, the charge trapping structure 110 may be formed on the substrate 100.

Figure 3:
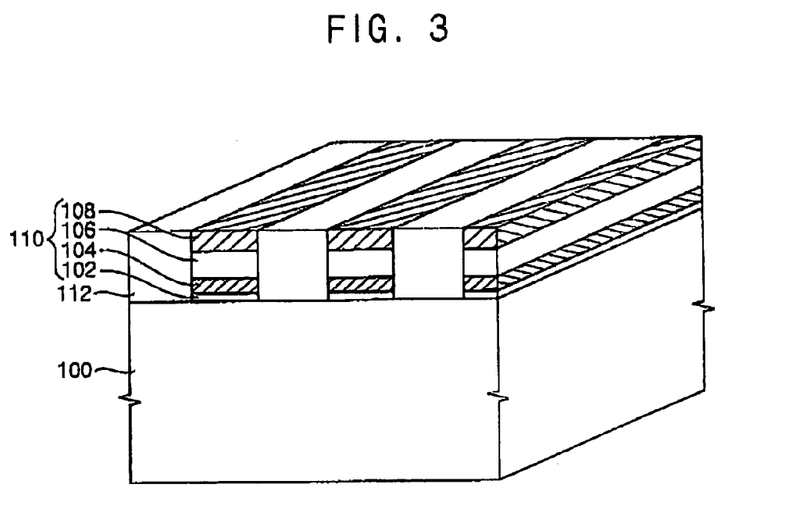

Referring to FIG. 3, the insulating interlayer 112 may be formed on the substrate 100. The insulating interlayer 112 may fill spaces adjacent to the charge trapping structure 110 without covering the charge trapping structure 110. That is, an upper surface of the first protection layer pattern 108 may be exposed.

In an implementation, a preliminary insulating interlayer (not shown) may be formed on the substrate 100 to cover the charge trapping structure 110, and then the preliminary insulating interlayer may be polished until the preliminary first protection layer pattern 108 is exposed. Accordingly, the insulating interlayer 112 exposing the preliminary first protection layer pattern 108 may be formed on the substrate 100. The insulating interlayer 112 may be formed using, e.g., a chemical mechanical polishing (CMP) process and/or an etch back process.

The polishing process for forming the insulating interlayer 112 may yield the preliminary first protection layer pattern 108 and the insulating interlayer 112 each having flat upper surfaces. In particular, the portion of the preliminary first protection layer pattern 108 that remains after polishing may have a thickness substantially the same as the step difference between the underlying preliminary buffer layer pattern 106 and the adjacent insulating interlayer 112. The remaining preliminary first protection layer pattern 108 may have a thickness in a range of about 50 Å to about 1,000 Å. If the remaining preliminary first protection layer pattern 108 has a thickness less than about 50 Å, the preliminary buffer layer pattern 106 may be damaged during successive etching processes, because the preliminary first protection layer pattern 108 may not be sufficiently thick enough to protect the preliminary buffer layer pattern 106. If the remaining preliminary first protection layer pattern 108 has a thickness greater than about 1,000 Å, the trench 122 may not be properly formed because of a large difference in thickness between the preliminary buffer layer pattern 106 and the insulating interlayer 112.

Figure 4:
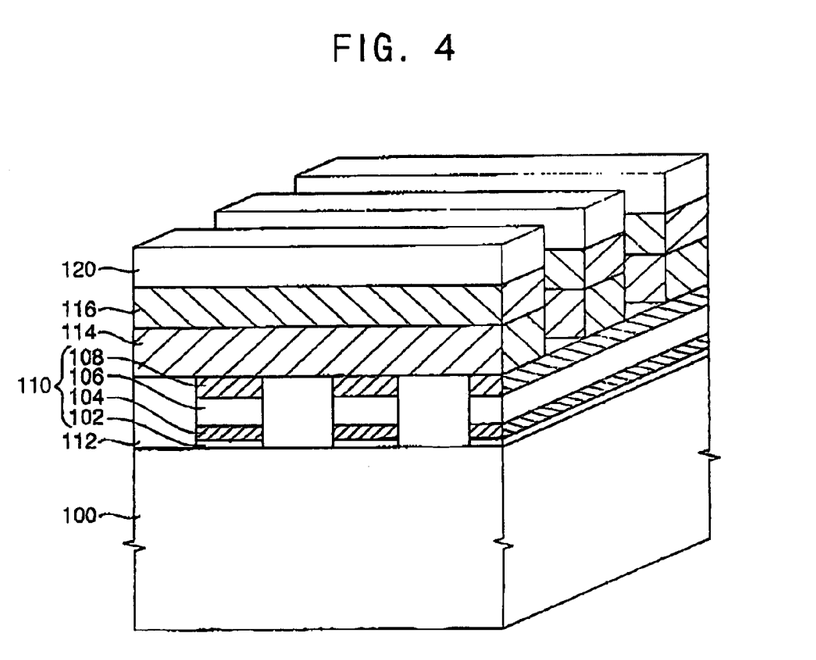

Referring to FIG. 4, a second protection layer pattern 114 and a hard mask pattern 116 may be successively formed on the insulating interlayer 112 and the preliminary first protection layer pattern 108. The second protection layer pattern 114 and the hard mask pattern 116 may have generally linear shapes and may extend in a second direction substantially perpendicular to the first direction.

In an implementation, a second protection layer (not shown) may be formed on the insulating interlayer 112 and the preliminary first protection layer pattern 108. The second protection layer may be formed using, e.g., a material substantially the same as that of the preliminary first protection layer pattern 108. For example, the second protection layer may be formed using a nitride such as silicon nitride. An amorphous carbon layer (not shown) may be formed on the second protection layer, and a photoresist pattern 120 may be formed on the amorphous carbon layer. The photoresist pattern 120 may have a generally linear shape and may extend in the second direction.

The amorphous carbon layer and the second protection layer may be etched using the photoresist pattern 120 as an etching mask to form the second protection layer pattern 114 and the hard mask pattern 116 on the insulating interlayer 112 and the preliminary first protection layer pattern 108. Simultaneously, a portion of the preliminary first protection layer 108 exposed along the second direction may be etched to form a first protection layer pattern 108*a*, as illustrated in FIG. 5. The second protection layer pattern 114, the hard mask pattern 116 and the first protection layer pattern 108*a* may be formed using, e.g., an anisotropic etching process. The first protection layer pattern 108*a* may have an island shape. Additionally, the hard mask pattern 116 may include amorphous carbon.

Referring to FIG. 5, the preliminary buffer layer pattern 106, the insulating interlayer 112, the preliminary charge trapping layer pattern 104 and the preliminary tunnel oxide layer pattern 102 may be partially etched along the second direction using the hard mask pattern 116 as an etching mask to yield a tunnel oxide layer pattern 102*a*, a charge trapping layer pattern 104*a* and a buffer layer pattern 106*a* formed on the substrate 100. The tunnel oxide layer pattern 102*a*, the charge trapping layer pattern 104*a* and the buffer layer pattern 106*a* may be formed using, e.g., an anisotropic etching process. Each of the tunnel oxide layer pattern 102*a*, the charge trapping layer pattern 104*a* and the buffer layer pattern 106*a* may have an island shape.

When the tunnel oxide layer pattern 102*a*, the charge trapping layer pattern 104*a* and the buffer layer pattern 106*a* are formed on the substrate 100, a portion of the substrate 100 may be exposed along the second direction. The photoresist pattern 120 and the hard mask pattern 116 may be removed using, e.g., one or more of an ashing process, a stripping process, etc.

In an implementation, the exposed portion of the substrate 100 may be thermally oxidized to form an active region having concave and convex edge portions covered with the hard mask pattern 116.

The exposed portion of the substrate 100 along the second direction may be partially etched to form the trench 122 in the upper portion of the substrate 100. The trench 122 may be formed using, e.g., an anisotropic etching process. In an implementation, a sidewall oxide layer may be formed on a sidewall of the trench 122, in order to cure damage to the substrate 100 that may be generated during the etching process for forming the trench 122. The sidewall oxide layer may be formed using, e.g., a thermal oxidation process.

Figure 6:
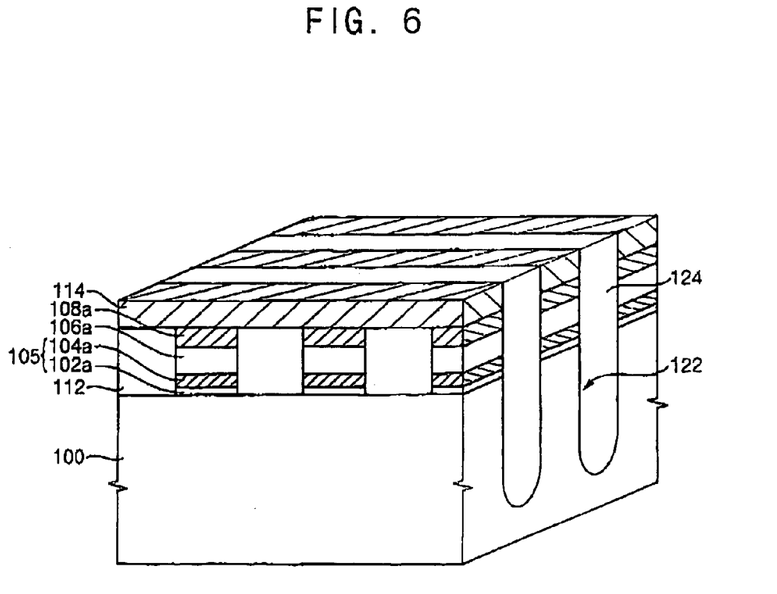

Referring to FIG. 6, the trench 122 may be filled with an insulation material to form an isolation layer pattern 124 in the trench 122. The isolation layer pattern 124 may have a multi-layered structure that includes two or more insulation films.

In an implementation, a first insulation film (not shown) may be formed to partially fill the trench 122. The first insulation film may be formed using, e.g., a first insulation material capable of easily filling the trench 122. For example, the first insulation film may be formed using a boro-phosphor silicate glass (BPSG), an undoped silicate glass (USG), etc. A second insulation film (not shown) may be formed on the first insulation film to completely fill the trench 122. The second insulation film may have a structure more dense than that of the first insulation film. For example, the second insulation film may be formed using a high density plasma (HDP) oxide. The second and the first insulation films may be partially removed to expose the second protection layer pattern 114, so that the isolation layer pattern 124 is formed in the trench 122. Thus, the isolation layer pattern 124 may include first and second insulation film patterns (not shown), where the first insulation film pattern partially fills up the trench 122 and the second insulation film pattern completely fills the trench 122.

Figure 7:
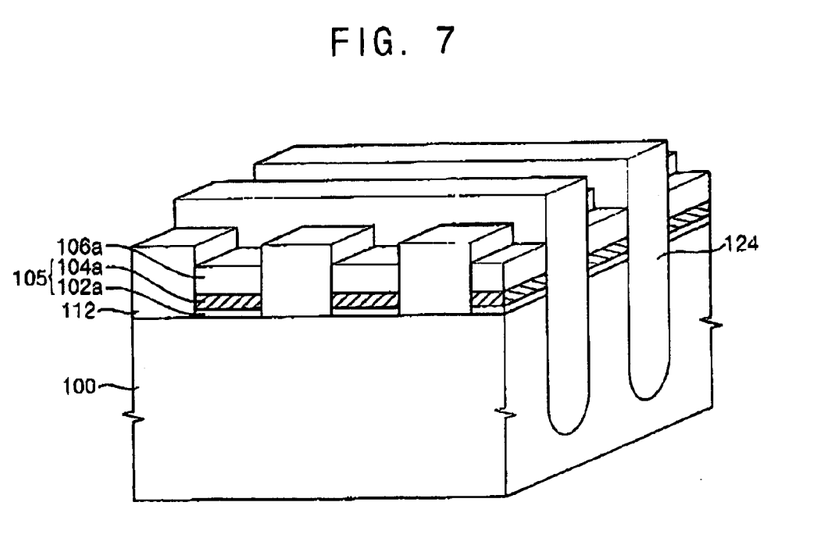

Referring to FIG. 7, the second protection layer pattern 114 and the first protection layer pattern 108a may be removed using, e.g., a wet etching process. After removal of the second protection layer pattern 114 and the first protection layer pattern 108a, the insulation interlayer 112 and the buffer layer pattern 106a may be exposed in the active region of the substrate 100, and the isolation layer pattern 124 may be exposed in a field region of the substrate 100.

The insulating interlayer 112 may have a height that is higher than that of the buffer layer pattern 106a after removal of the first protection layer pattern 108a. That is, a relatively large step may be defined between the buffer layer pattern 106a and the insulating interlayer 112. The first protection layer pattern 106a may have a thickness greater than about 50 Å, and the step between the buffer layer pattern 106a and the insulating interlayer 112 may also have a height greater than about 50 Å.

Figure 8:
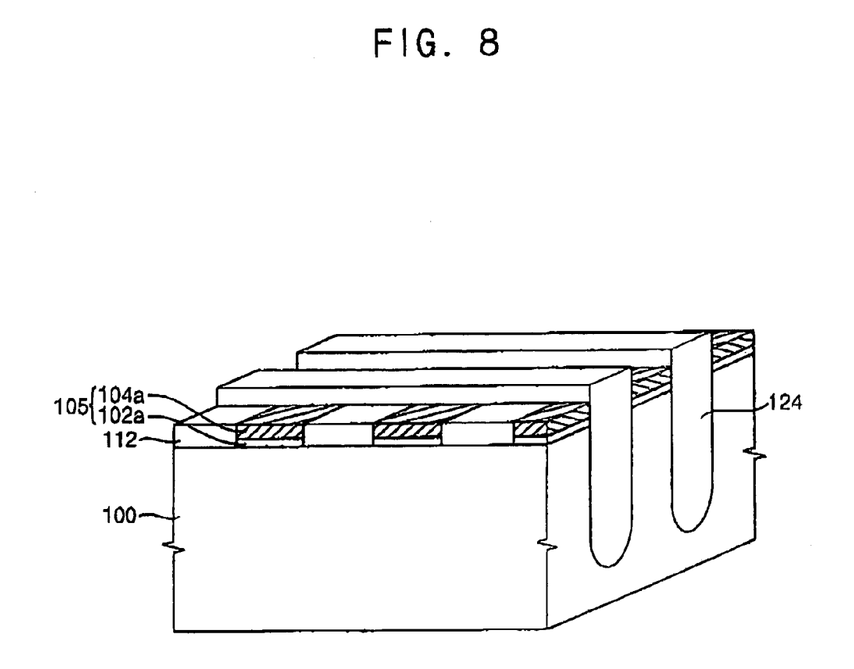

FIG. 11 illustrates a plan view of the isolation layer pattern 124 and the charge trapping layer pattern 104a. Referring to FIGS. 8 and 11, the buffer layer pattern 106a may be removed from the charge trapping layer pattern 104a. The buffer layer pattern 106a may be removed using, e.g., a wet etching process, in order to reduce or prevent damage to the charge trapping layer pattern 104a during the etching process for removing the buffer layer pattern 106a. In etching the buffer layer pattern 106a, the insulating interlayer 112 and the isolation layer pattern 124 may also be partially etched. In particular, the insulating interlayer 112 and the isolation layer pattern 124 may each include oxides, which may be partially etched.

The insulating interlayer 112 may have an upper surface that is higher than that of the charge trapping layer pattern 104a after the etching process just described. This height difference may help define the subsequently-formed dielectric layer 126. In particular, referring to FIG. 7, if the height difference between the insulating interlayer 112 and the charge trapping layer pattern 104a is inadequate, then after the above-described etching process, the dielectric layer 126 that is subsequently formed on the charge trapping layer pattern 104a may be undesirably close to the tunnel oxide layer pattern 102a. For example, if the height difference is inadequate, the etching process may leave the insulating interlayer 112 with an upper surface that is lower than that of the adjacent charge trapping layer pattern 104a. In such a case, the dielectric layer 126 and the tunnel oxide layer 102a may be too close to each other, and, in the completed device, charges may be trapped not only in the charge trapping layer pattern 104a, but also in the dielectric layer 126. This may result in a failure of the charge trapping type non-volatile memory device during a programming operation of the charge trapping type non-volatile memory device.

In an implementation, the insulating interlayer 112 may have an upper surface substantially even with that of the charge trapping layer pattern 104a after the above-described etching process. That is, the height of the insulating interlayer 112 with respect to that of the buffer layer pattern 106a may be determined so as to prevent generating a downward step from the insulating interlayer 112 to the charge trapping layer pattern 104a. Additionally, the etching process may be adjusted in order to properly remove the insulating interlayer 112, while removing the buffer layer pattern 106a completely.

Referring to FIG. 9, the dielectric layer 126 may be formed on the charge trapping layer pattern 104a, the insulating interlayer 112 and the isolation layer pattern 124. The dielectric layer 126 may be formed using, e.g., a metal oxide that has a dielectric constant substantially higher than that of silicon oxide. For example, the dielectric layer 126 may be formed using one or more of aluminum oxide, hafnium oxide, zirconium oxide, titanium oxide, tantalum oxide, etc. In an implementation, the dielectric layer 126 may be formed using aluminum oxide.

The dielectric layer 126 may be continuously formed across the upper surfaces of the charge trapping layer pattern 104a, the insulating interlayer 112 and the isolation layer pattern 124, such that a same dielectric layer 126 is provided for adjacent unit memory devices, whereas an island-shaped charge trapping layer 104a may be discrete to each of the adjacent memory devices.

An electrode layer 132 may be formed on the dielectric layer 126. The electrode layer 132 may have a multi-layered structure that includes two or more conductive films. The electrode layer 132 may be formed using, e.g., a metal, a metal nitride, a mixture thereof, etc.

In an implementation, the electrode layer 132 may include a lower electrode film 128 and an upper electrode film 130 that are sequentially formed on the dielectric layer 126. The lower electrode film 128 may be formed using, e.g., a first conductive material having a high work function. The work function of the first conductive material may be greater than about 4.5 eV. The lower electrode film 128 may include, e.g., a metal nitride such as tantalum nitride. The upper electrode film 130 may be formed using a second conductive material having a resistance lower that that of the first conductive material. The upper electrode film 130 may be more easily patterned than the lower electrode film 128. The upper electrode film 130 may include, e.g., a metal such as tungsten.

In an implementation, a metal barrier layer (not shown) may be formed between the lower electrode film 128 and the upper electrode film 130. The metal barrier layer may include, e.g., a metal nitride such as tungsten nitride.

FIG. 12 illustrates a plan view of the dielectric layer 126 and the electrode layer 132. Referring to FIGS. 10 and 12, an additional hard mask pattern (not shown) may be formed on the electrode layer 132. The additional hard mask pattern may have a generally linear shape and may extend in the first direction. The additional hard mask pattern may correspond to the charge trapping layer pattern 104a. The additional hard mask pattern may include, e.g., a nitride such as silicon nitride. In an implementation, the additional hard mask pattern may have a width greater than that of the charge trapping layer pattern 104a.

The electrode layer 132 may be etched using the additional hard mask pattern as an etching mask, in order to form an electrode structure 132a on the dielectric layer 126. The electrode structure 132a may include a lower electrode 128a and an upper electrode 130a formed on the dielectric layer 126. The electrode structure 132a may have a width greater than that of the charge trapping layer pattern 104a. Thus, the electrode structure 132a may be properly formed over the charge trapping layer pattern 104a, and the process may tolerate an alignment error in an etching process for forming the electrode structure 132a.

The etching process that patterns the electrode layer 132 to form the electrode structure 132a may not pattern the underlying dielectric layer 126. Accordingly, while the unit memory device may include a discrete charge trapping layer pattern 104a, i.e., adjacent memory devices may not share a common trapping layer pattern 104a, the unit memory device may include a continuous dielectric layer 126, i.e., adjacent memory devices may share a common dielectric layer 126. As a result, horizontal migration of charges stored in the charge trapping layer pattern 104a may be effectively prevented, while avoiding process steps that would otherwise be required by patterning the dielectric layer 126. Additionally, the electrode structure 132a may have a reduced resistance.

In a charge trapping type non-volatile memory device according to the present invention, the migration of charges stored in a charge trapping layer pattern may be reduced or eliminated. Thus, the charge trapping type non-volatile memory device may have improved electrical characteristics, and may reduce or prevent failures caused by the horizontal migration of charges. Further, the charge trapping type non-volatile memory device may have enhanced operational characteristics because an electrode structure may be defined on a dielectric layer that is formed without patterning the dielectric layer.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a memory device, comprising:
    forming a charge trapping layer on a substrate;
    forming a protection layer and a buffer layer on the charge trapping layer;
    forming an insulating layer on the substrate adjacent to the charge trapping layer, wherein an upper surface of the charge trapping layer is exposed by the insulating layer, and forming the insulating layer includes:
        depositing an insulating material on the substrate to cover the charge trapping layer, the protection layer, and the buffer layer, and
        polishing the insulating material until it has a thickness in a range of about 50 Å to about 100 Å, wherein the polishing also exposes the protection layer;
    forming a dielectric layer on the exposed charge trapping layer and on the adjacent insulating layer;
    forming an electrode on the dielectric layer, the electrode corresponding to the charge trapping layer; and
    forming an isolation layer in a trench in the substrate, wherein the isolation layer projects above the protection layer,
    removing the protection layer so as to expose the buffer layer, the buffer layer having a height lower than that of the insulating layer; and
    removing the buffer layer and partially removing the insulating layer and the isolation layer while maintaining an upper surface of the insulating layer at a height equal to or above a height of an upper surface of the charge trapping layer.

2. The method as claimed in claim 1, wherein the charge trapping layer includes a nitride-based charge trapping material.

3. The method as claimed in claim 1, wherein the dielectric layer includes metal oxide.

4. The method as claimed in claim 1, wherein the electrode has a width that is substantially greater than a corresponding width of the charge trapping layer.

5. The method as claimed in claim 1, wherein the memory device is close by an adjacent memory device,
    the charge trapping layer is discrete to the memory device,
    the adjacent memory device includes an adjacent charge trapping layer discrete to the adjacent memory device, and
    the dielectric layer is continuous across the charge trapping layer and the adjacent charge trapping layer.

6. The method as claimed in claim 1,
    wherein
    the dielectric layer is disposed on the isolation layer.

7. The method as claimed in claim 1, wherein forming the electrode includes forming an electrode layer on the dielectric layer; and
    patterning the electrode layer without patterning the dielectric layer.

8. The method as claimed in claim 1, wherein the electrode is formed to overlap only a single charge trapping layer.

9. The method as claimed in claim 1, wherein a distance from an upper surface of the insulating layer to an upper surface of the substrate is formed to be equal to or larger than a distance from an upper surface of the charge trapping layer to a same reference point on the upper surface of the substrate, upper surfaces of the insulating layer and charge trapping layer facing away from the substrate.

10. The method as claimed in claim 9, wherein the upper surfaces of the insulating layer and charge trapping layer are formed to be substantially coplanar with each other.

11. The method as claimed in claim 9, wherein a sidewall of the insulating layer is formed to be in direct contact with a sidewall of the charge trapping layer, sidewalls of the insulating layer and charge trapping layer being perpendicular to the upper surfaces of the insulating layer and charge trapping layer.

12. The method as claimed in claim 1, wherein the dielectric layer is formed directly on upper surfaces of both the insulating layer and charge trapping layer, upper surfaces of the insulating layer and charge trapping layer facing away from the substrate.

* * * * *